US012717985B2

(12) United States Patent
Smith et al.

(10) Patent No.: US 12,717,985 B2
(45) Date of Patent: Aug. 25, 2026

(54) RELEVANCE PROPAGATION OF INFORMATION IN MODEL ANALYSIS

(71) Applicant: The Boeing Company, Chicago, IL (US)

(72) Inventors: Brian S. Smith, Charleston, SC (US); Sreenivasa Prasath Subramani, Bengaluru (IN)

(73) Assignee: The Boeing Company, Arlington, VA (US)

( * ) Notice: Subject to any disclaimer, the term of this patent is extended or adjusted under 35 U.S.C. 154(b) by 1002 days.

(21) Appl. No.: 17/855,347

(22) Filed: Jun. 30, 2022

(65) Prior Publication Data

US 2024/0005063 A1 Jan. 4, 2024

(51) Int. Cl.

| | |
|---|---|
| ***G06F 30/23*** | (2020.01) |
| ***G06F 30/27*** | (2020.01) |
| ***G06N 3/08*** | (2023.01) |

(52) U.S. Cl.

CPC .............. *G06F 30/23* (2020.01); *G06F 30/27* (2020.01); *G06N 3/08* (2013.01)

(58) Field of Classification Search

CPC ........... G06F 30/23; G06F 30/27; G06N 3/08; G06N 3/045

See application file for complete search history.

(56) References Cited

U.S. PATENT DOCUMENTS

| | | | | |
|---|---|---|---|---|
| 11,531,902 | B2 * | 12/2022 | Horesh | G06N 3/048 |
| 2005/0234839 | A1 * | 10/2005 | Haudrich | G06N 3/10 702/33 |
| 2006/0229753 | A1 * | 10/2006 | Seskin | G06F 30/20 700/97 |
| 2022/0101063 | A1 * | 3/2022 | Chau | G06N 3/082 |

OTHER PUBLICATIONS

Sanchez-Gonzalez, Alvaro; Godwin, Jonathan; Pfaff, Tobias; Ying, Rex; Leskovec, Jure; Bataglia, Peter W., Learning to Simulate Complex Physics with Graph Networks, Proceedings of the 37th International Conference on Machine Learning, 2020.

(Continued)

*Primary Examiner* — Chuen-Meei Gan

(74) *Attorney, Agent, or Firm* — Alleman Hall LLP

(57) ABSTRACT

A system includes a storage device, a processor, and an output device. The storage device is configured to store first results generated by perturbations of a structure, and store input parameters of a model of the structure. The processor is configured to generate results by exercising the model with the perturbations, and train a neural network to replicate the second results. The neural network includes input nodes and output nodes. A subset of the input nodes represent the input parameters. The output nodes represent the second results. The processor is further configured to run a propagation through the neural network as inverted from the output nodes to the input nodes to identify the input parameters that impact the second results, and generate gradient values that represent how the second results deviate from the first results. The output device is configured to present a gradient graph of the gradient values.

20 Claims, 8 Drawing Sheets

(56) References Cited

OTHER PUBLICATIONS

Bach, Sebastian; Binder, Alexander; Montavon, Gregoire; Klauschen, Frederick; Muller, Klaus-Robert; Samek, Wojchiech, On Pixel-Wise Explanations for Non-Linear Classifier Decisions by Layer-Wise Relevance Propagation, PLOS One, Spain, Jul. 10, 2015.

Alet, Ferran; Jeewajee, Adarsh K.; Bauza, Maria; Rodriguez, Alberto; Lozano-Perez, Tomas; Kaelbling, Leslie Pack, Graph Element Networks: adaptive, structured computation and memory, Proceedings of the 36th INternational Conference on Machine Learning, Cambridge, MA, 2019.

* cited by examiner

RELEVANCE PROPAGATION OF INFORMATION IN MODEL ANALYSIS

TECHNICAL FIELD

The disclosure relates generally to adjusting finite element models, and in particular, to relevance propagation of information in a model analysis.

BACKGROUND

Finite element models are designed to match test results of physical products. When the models get large, the models display modal analysis behaviors that differ from the test results. The large models generally do not have healthy gradients because nodal displacements are non-normal. Therefore, small variations in the model parameters may result in large variations in eigenvalues. The variations present challenges to determine which features are relevant and which features are not relevant.

Existing solutions typically involve some guess-and-check process where one or more variables in the models are adjusted in an attempt to improve the solutions. The models are then rerun to check the efficacy of the updates. The process is repeated until the behaviors of the models are sufficiently close to the physical structures. Because the models are rerun at each step, the existing solutions are computationally expensive and long processes.

Accordingly, those skilled in the art continue with research and development efforts in the field of finite element model analysis and adjustment.

SUMMARY

A system is provided herein. The system includes a storage device, a processor, and an output device. The storage device is configured to store a plurality of first results generated by one or more perturbations of a structure, and store a plurality of input parameters of a model of the structure. The model is generated by a finite element modeling. The processor is configured to generate a plurality of second results by exercising the model with the one or more perturbations, and train a neural network to replicate the plurality of second results. The neural network includes a plurality of input nodes and a plurality of output nodes. A subset of the plurality of input nodes represent the plurality of input parameters of the model. The plurality of output nodes represent the plurality of second results. The processor is further configured to invert the neural network, run a propagation through the neural network as inverted from the plurality of output nodes to the plurality of input nodes to identify one or more of the plurality of input parameters of the model that impact the plurality of second results, and generate a plurality of gradient values that represent how the plurality of second results deviate from the plurality of first results. The output device is configured to present a gradient graph of the plurality of gradient values.

In one or more embodiments of the system, the processor is further configured to receive a query of an area of interest in the gradient graph, and identify a subset of the plurality of input parameters of the model that are associated with the area of interest in the gradient graph.

In one or more embodiments of the system, the processor is further configured to reduce the plurality of gradient values within the area of interest by automatically adjusting one or more of the plurality of input parameters in the subset.

In one or more embodiments of the system, the plurality of gradient values in the area of interest determine if the one or more of the plurality of input parameters are increased or decreased.

In one or more embodiments of the system, the propagation is a layer-wise relevance propagation.

In one or more embodiments of the system, the neural network is a graph neural network.

In one or more embodiments of the system, the neural network includes an input layer that includes the plurality of input nodes, an output layer that includes the plurality of output nodes, and at least one hidden layer that couples the input layer to the output layer.

In one or more embodiments of the system, one or more of a plurality of output edges in the at least one hidden layer loops back to one or more of a plurality of input edges in the at least one hidden layer.

In one or more embodiments of the system, the output device is one or more of a display and a printer.

A method for relevance propagation in a model of a structure is provided herein. The method includes reading from a storage device a plurality of first results generated by one or more perturbations of the structure, and reading a plurality of input parameters of the model of the structure. The model is generated by a finite element modeling. The method further includes generating a plurality of second results by exercising the model with the one or more perturbations, and training a neural network to replicate the plurality of second results. The neural network includes a plurality of input nodes and a plurality of output nodes. A subset of the plurality of input nodes represent the plurality of input parameters of the model. The plurality of output nodes represent the plurality of second results. The method further includes inverting the neural network, running a propagation through the neural network as inverted from the plurality of output nodes to the plurality of input nodes to identify one or more of the plurality of input parameters of the model that impact the plurality of second results, generating a plurality of gradient values that represent how the plurality of second results deviate from the plurality of first results, and presenting a gradient graph of the plurality of gradient values from an output device.

In one or more embodiments, the method further includes receiving a query of an area of interest in the gradient graph, and identifying a subset of the plurality of input parameters of the model that are associated with the area of interest in the gradient graph.

In one or more embodiments, the method further includes reducing the plurality of gradient values within the area of interest by automatically adjusting one or more of the plurality of input parameters in the subset.

In one or more embodiments, the method further includes determining if the one or more of the plurality of input parameters are to be increased or decreased in response to the plurality of gradient values in the area of interest.

In one or more embodiments of the method, the propagation is a layer-wise relevance propagation.

In one or more embodiments of the method, the neural network is a graph neural network.

In one or more embodiments of the method, the neural network includes an input layer that includes the plurality of input nodes, an output layer that includes the plurality of output nodes, and at least one hidden layer that couples the input layer to the output layer.

In one or more embodiments, the method further includes looping back one or more of a plurality of output edges in the at least one hidden layer to one or more of a plurality of input edges in the at least one hidden layer.

In one or more embodiments of the method, the output device is one or more of a display and a printer.

A non-transitory computer readable storage media containing processor executable instructions is provided herein. The processor executable instructions cause a processor to perform the steps of reading from a storage device a plurality of first results generated by one or more perturbations of a structure, and reading a plurality of input parameters of the model of the physical structure. The model is generated by a finite element modeling. The processor further performs the steps of generating a plurality of second results by exercising the model with the one or more perturbations, and training a neural network to replicate the plurality of second results. The neural network includes a plurality of input nodes and a plurality of output nodes. A subset of the plurality of input nodes represent the plurality of input parameters of the model. The plurality of output nodes represent the plurality of output results. The processor further performs the steps of inverting the neural network, running a propagation through the neural network as inverted from the plurality of output nodes to the plurality of input nodes to identify one or more of the plurality of input parameters of the model that impact the plurality of second results, generating a plurality of gradient values that represent how the plurality of second results deviate from the plurality of first results, and presenting a gradient graph of the plurality of gradient values from an output device.

In one or more embodiments of the non-transitory computer readable storage media, the processor further performs the steps of receiving a query of an area of interest in the gradient graph, identifying a subset of the plurality of input parameters of the model that are associated with the area of interest in the gradient graph, and reducing the plurality of gradient values within the area of interest by automatically adjusting one or more of the plurality of input parameters in the subset.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure include a system and/or a method that trains a neural network to solve finite element model issues. A generated model is used to propagate output data of the finite element model back through an inverted neural network to relevant inputs. The propagations may implement a back propagation or a layer-wise relevance propagation. The propagation highlights factors in the input data that effects the output of a region of interest or node. The input data may subsequently be automatically or manually adjusted to improve a match between the finite element model and a corresponding physical structure. Layer-wise relevance propagation is an explanation technique applicable to models structured as neural networks, where the inputs are associated with complex structures. The layer-wise relevance propagation operates by propagating a prediction f(x) backward in the neural network using propagation rules.

Figure 1:
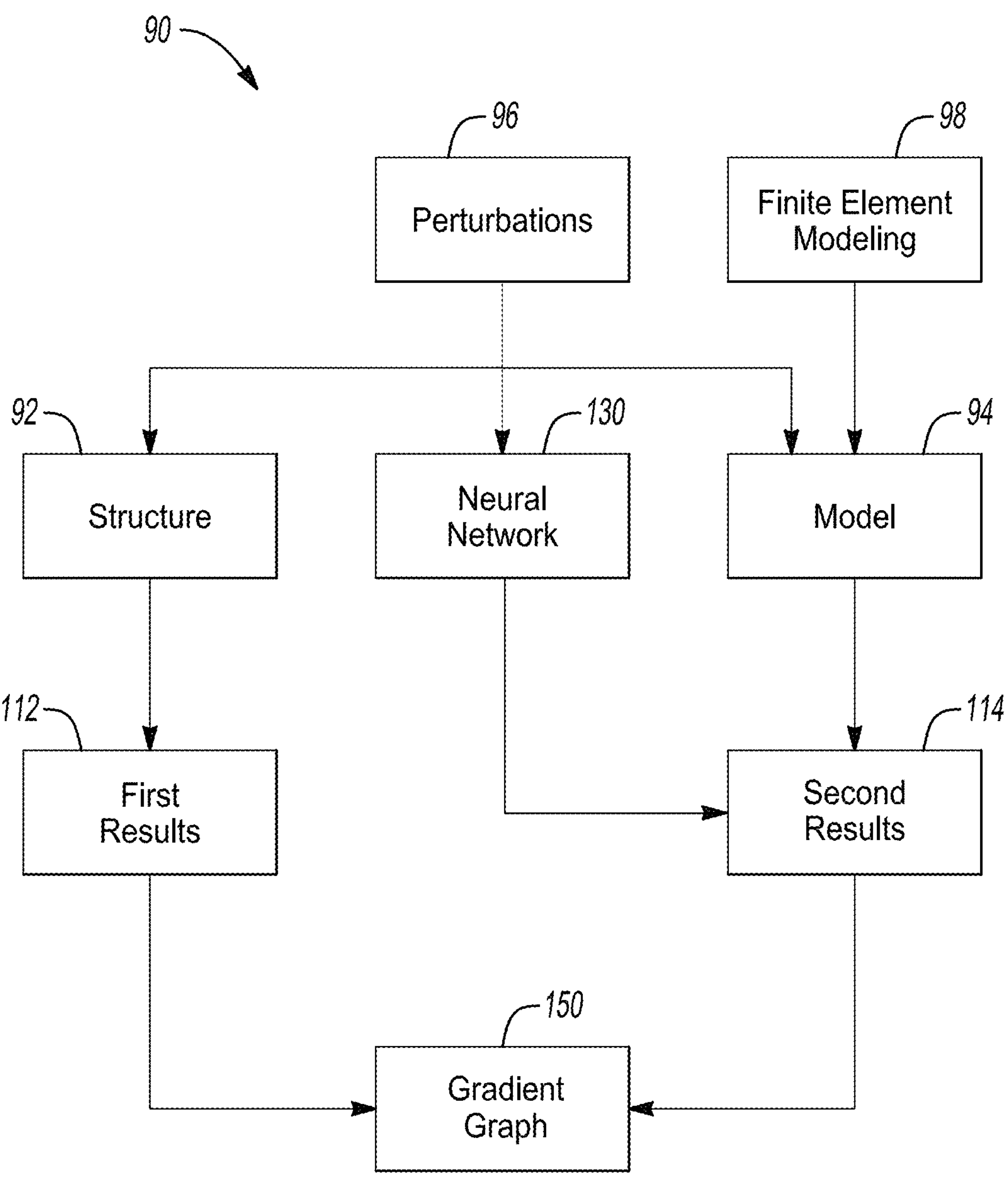
FIG. 1 is a schematic diagram of illustrating a context for improving models in accordance with one or more exemplary embodiments.

Referring to FIG. 1, a schematic diagram of an example environment 90 illustrating a context for improving models is shown in accordance with one or more exemplary embodiments. The environment 90 includes a structure 92, a model 94, one or more perturbations 96, a finite element modeling 98, first results 112, second results 114, a neural network 130, and a gradient graph 150.

The structure 92 implements a real-world object. The structure 92 may be represented by the model 94. The first results 112 are created where the structure 92 is subjected to the perturbations 96. The second results 114 are created where the model 94 is subjected to the same perturbations 96.

The model 94 is implemented by a finite element modeling 98 of the structure 92. Nodes of the model 94 represent a shape and a structure of the physical structure 92 being modeled. By way of example, a modeling of the structure 92 may contain hundreds of nodes in a mesh. A dozen nodes may be fixed in place, and another dozen nodes may receive an applied force. The remaining nodes contain encodings that indicate where the remaining nodes are in space and what other nodes are interconnected.

The perturbations 96 may involve motion disturbances, changes in arrangements, and/or changes in equilibrium states. The perturbations 96 are applied to the structure 92, the model 94, and the neural network 130 to generate the various results. In various embodiments, the perturbations 96 to the model 94 may represent various changes that an engineer wants to make and/or apply to the structure 92. For example, the perturbations 96 may be applied forces and/or changes to a complex structure 92 to meet factors of safety criteria.

The neural network 130 is trained to mimic the behavior of the model 94. While the neural network 130 is subjected to the perturbations 96, the neural network 130 may generate results that are initially similar to, but different from the second results 114. As the training continues, the neural network 130 learns to replicate the second results 114. Once the neural network 130 is trained, the first results 112 and the second results 114 are used to generate the gradient graph 150. The gradient graph 150 generally shows how the second results 114 from the neural network 130 (and the model 94) are different from the first results 112 from the structure 92. Using the gradient graph 150 to identify one or more areas of interest, the input parameters of the model 94 that strongly influence the gradient values in the areas of interest may be identified. Thereafter, the input parameters are automatically or manually adjusted to improve a fidelity of the model 94 to the structure 92 being represented.

Multiple input nodes of the neural network 130 represent the nodes present in the model 94. A fraction of the input nodes of the neural network 130 may contain input parameters of the model 94. Outputs of the neural network 130 are nodal displacements that indicate how much each node moves when an input force (e.g., a perturbation 96) is applied to the model 94 under predetermined input boundary conditions.

Figure 2:
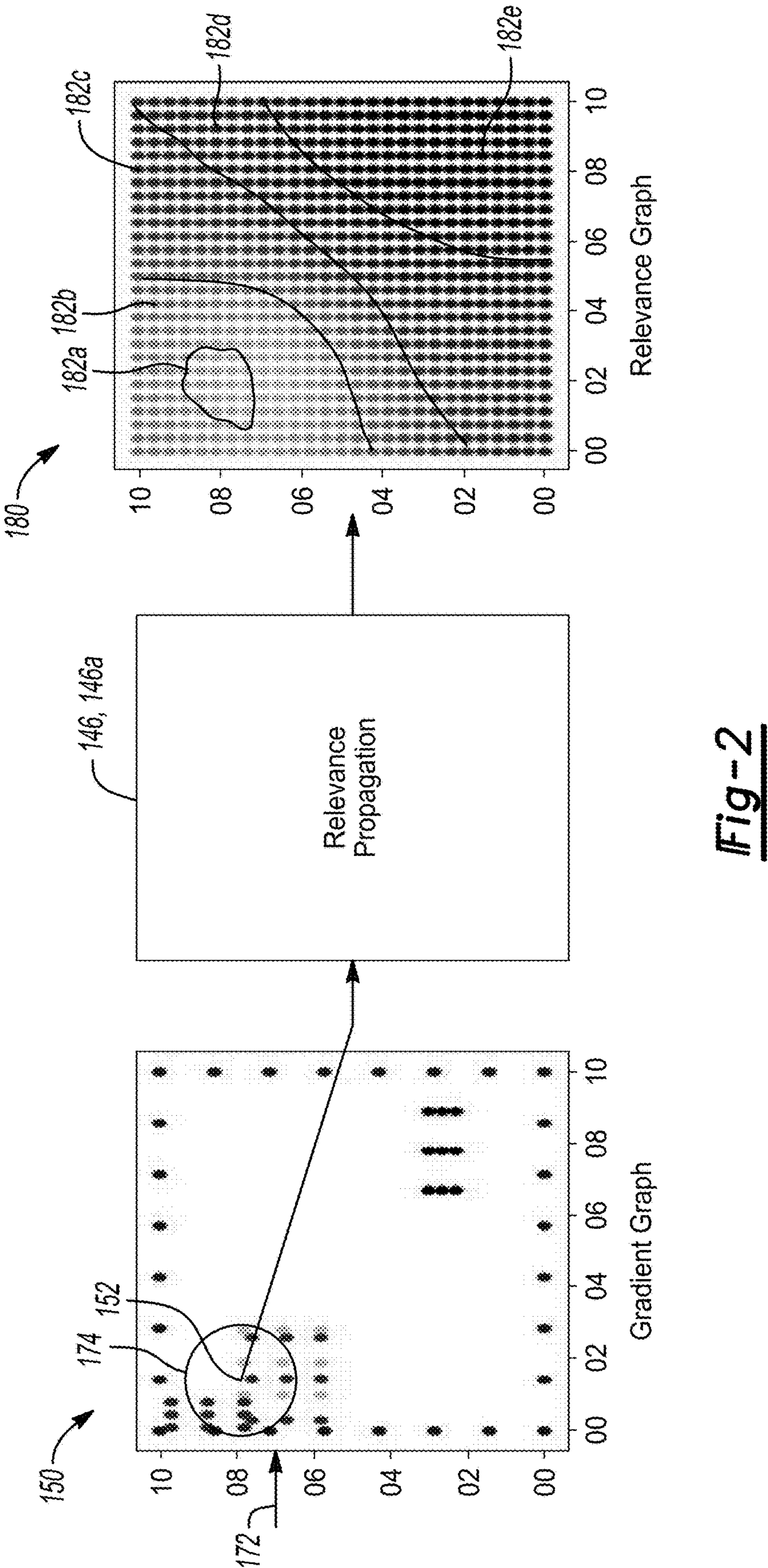
FIG. 2 is a functional flow diagram of a conversion of a gradient graph into a relevance graph in accordance with one or more exemplary embodiments.

Referring to FIG. 2, a functional flow diagram of an example conversion of the gradient graph 150 into a relevance graph is shown in accordance with one or more exemplary embodiments. The flow is used to identify which input parameters of the model 94 may be adjusted to correct mismatches between the first results 112 and the second results 114. The gradient values 152 indicate if the various input parameters should be increased or decreased.

After the gradient graph 150 has been generated and presented to a person, the person may submit a query that identifies an area of interest 174 in the gradient graph 150. One or more propagations 146 backwards through the neural network 130 are performed for the gradient values within the area of interest 174. The propagations 146 start from the output nodes and work back to the input nodes. In various embodiments, the propagations 146 may implement layer-wise relevance propagations 146*a*. Data for a relevance graph 180 is generated in response to the layer-wise relevance propagations 146*a*. The relevance graph 180, optionally displayed, correlates the input nodes that influence the gradient values 152 in the area of interest 174 within the gradient graph 150. The relevance graph 180 includes multiple relevance values 182*a*-182*e* of the input parameters. The relevance values 182*a*-182*e* range from most relevant values 182*a* to least relevant values 182*e*. While five degrees of the relevance values 182*a*-182*e* are illustrated, fewer or more degrees of relevance values may be implemented to meet a design criteria of a particular application.

In situations where the input parameters of the model 94 are manually adjusted, the person making the adjustments may identify the most relevant values 182*a* in the relevance graph 180, as displayed. From a position of the most relevant values 182*a*, the person may identify the corresponding input parameters. Subsequently, the corresponding input parameters may be manually adjusted based on the gradient values 152. In situations where a processor automatically adjusts the input parameters of the model 94, the processor may find the most relevant values 182*a* in the relevance graph 180, identify the corresponding input parameters, and automatically adjust the corresponding input parameters based on the gradient values 152. Thereafter, the updated model 94 may by stimulated again by the perturbations 96 and updated second results 114 may be compared with the first results 112 to determine if the adjustments result in a better match between the model 94 and the structure 92.

Figure 3:
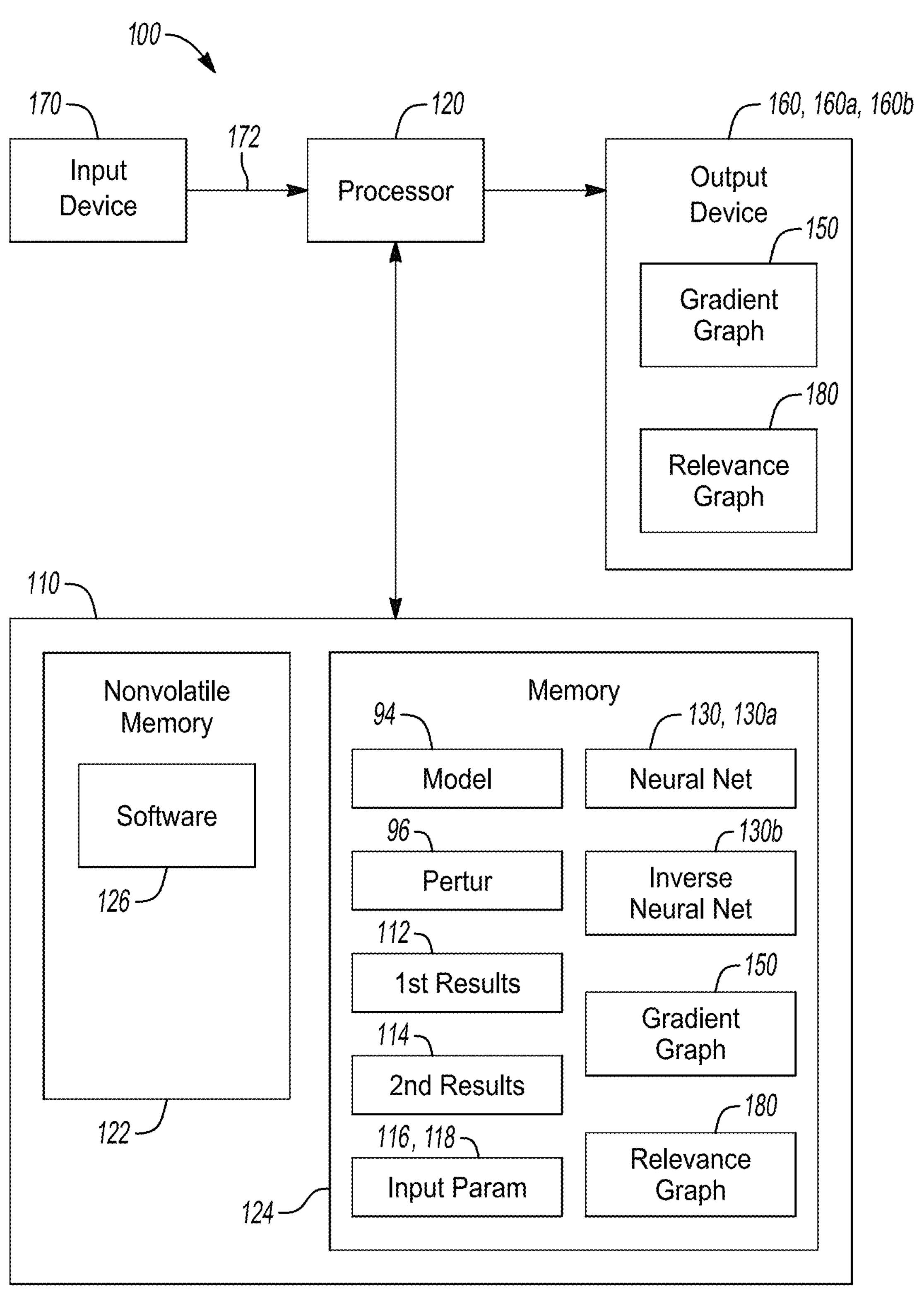
FIG. 3 is a schematic diagram of a system in accordance with one or more exemplary embodiments.

Referring to FIG. 3, a schematic diagram of an example implementation of a system 100 is shown in accordance with one or more exemplary embodiments. The system 100 is operational to analyze the relevance propagation of the model 94 using the neural network 130. The system 100 generally includes a storage device 110, a processor 120, an output device 160 and an input device 170.

The storage device 110 may include a non-transitory computer readable storage media 122 and a memory 124. The storage device 110 is operational to store software and data used and/or generated by the processor 120. The non-transitory computer readable storage media 122 implements a nonvolatile memory. The memory 124 may implement a volatile and/or nonvolatile memory.

The processor 120 implements one or more central processing units (CPU). The processor 120 is operational to execute software. The software may be stored in the non-transitory computer readable storage media 122. Data consumed and generated by the processor 120 may be stored in the memory 124.

The non-transitory computer readable storage media 122 may store at least the software (e.g., processor executable instructions 126) executed by the processor. The memory 124 may store at least the first results 112, the second results 114, the input parameters 116 (including a subset 118 of the input parameters 116), the neural network 130 (e.g., a graph neural network 130*a* and an inverted neural network 130*b*), data for the gradient graph 150, and data for the relevance graph 180. In various embodiments, some of the information stored in the memory 124 may be stored in the non-transitory computer readable storage media 122.

The output device 160 implements one or more of a display 160*a* and a printer 160*b*. The output device 160 is in communication with the processor 120 to receive data for presentation to one or more people. The output device 160 is operational to present the gradient graph 150 and the relevance graph 180. In various embodiments, the output device 160 may be multiple output devices. For example, one output device 160 may present the gradient graph 150 and the other presents the relevance graph 180.

The input device 170 implements a human machine interface. The input device 170 is operational to allow the people to enter a query 172 by moving a cursor around in the gradient graph 150 to select the area of interest 174 (FIG. 2). The input device 170 may include a keyboard that enables the people to change the input parameters of the model 94 identified using the relevance graph 180.

Figure 4:
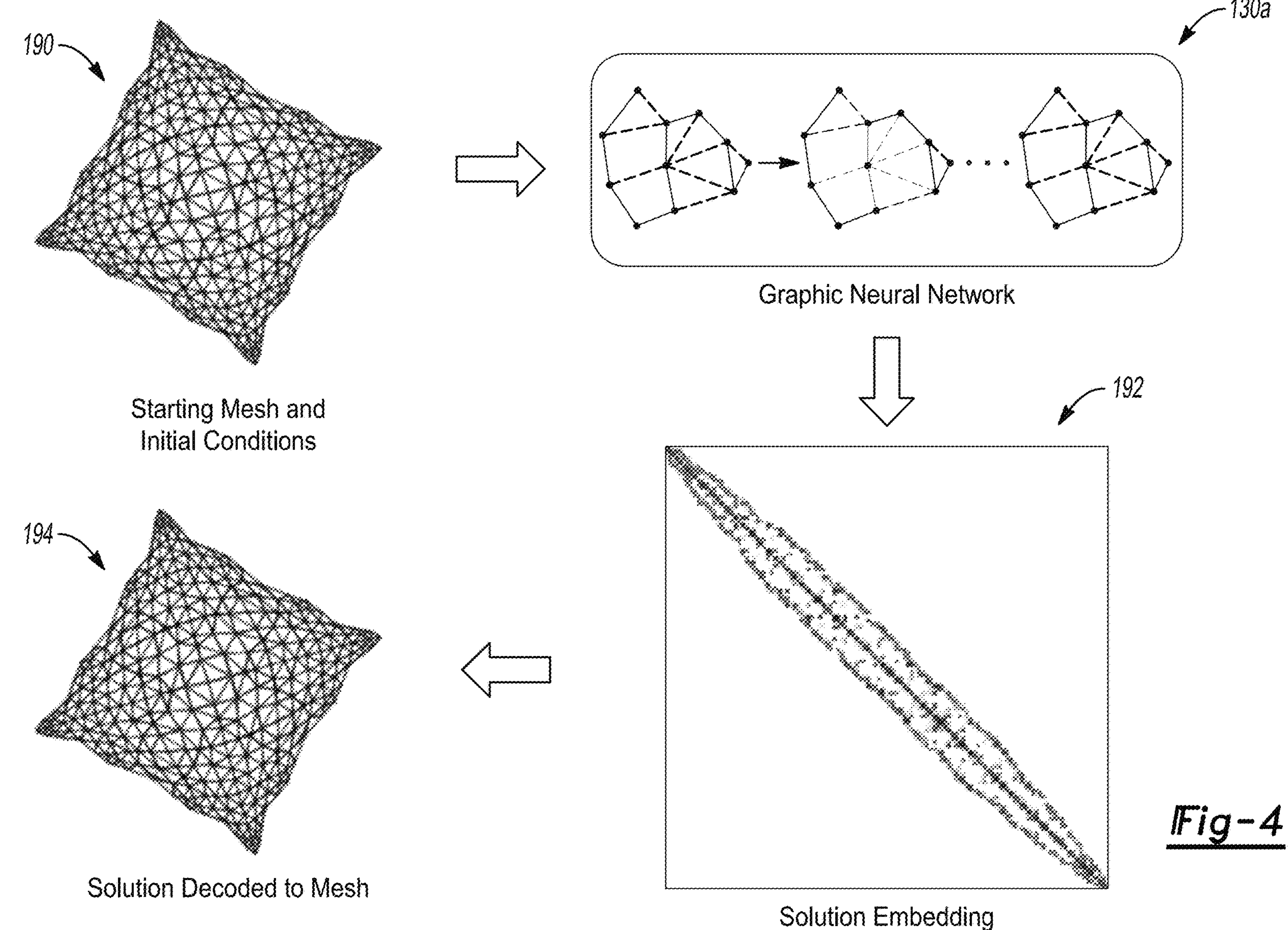
FIG. 4 is a schematic diagram of a training operation in accordance with one or more exemplary embodiments.

Referring to FIG. 4, a schematic diagram of an example training operation is shown in accordance with one or more exemplary embodiments. The operation begins with a starting mesh and initial conditions of the model 94 in the block 190. The neural network 130 (e.g., a graph neural network 130*a*) utilizes the starting mesh and the initial conditions for solution embedding in the block 192. Thereafter, the solution is decoded to create a reproduced mesh in the block 194.

Figure 5:
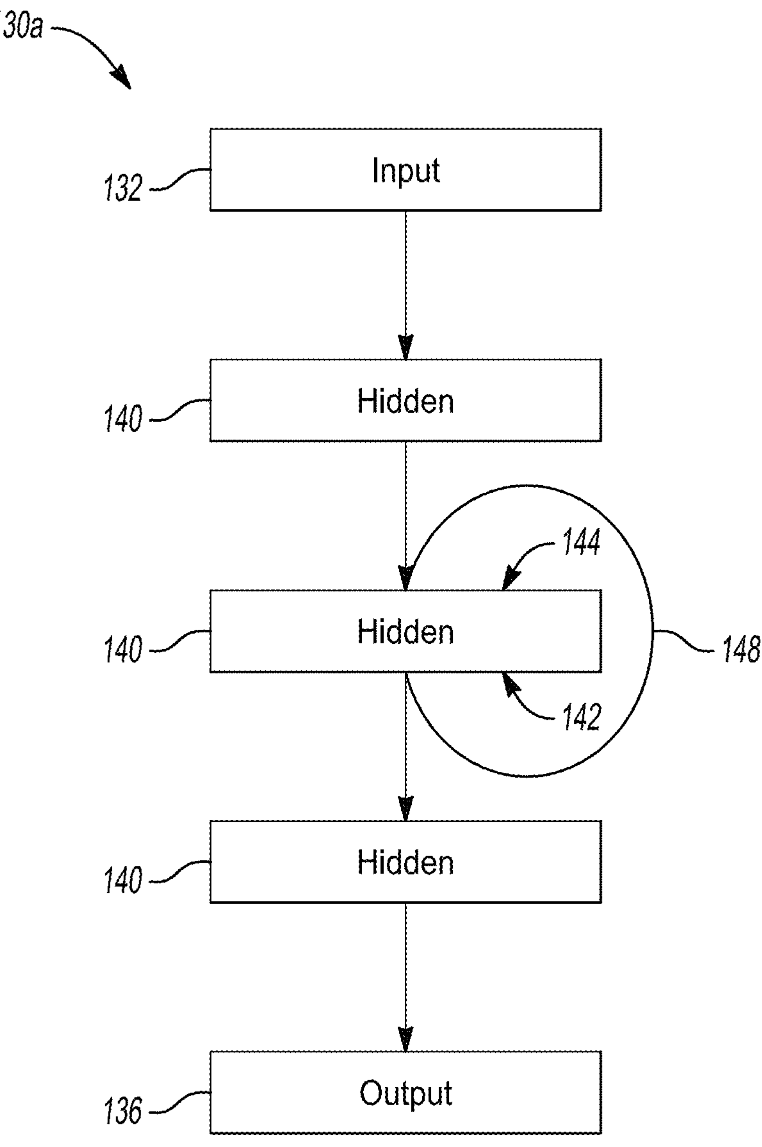
FIG. 5 is a schematic diagram of a graph neural network in accordance with one or more exemplary embodiments.

Referring to FIG. 5, a schematic diagram of an example graph neural network 130*a* is shown in accordance with one or more exemplary embodiments. The graph neural network 130*a* generally includes an input layer 132 and an output layer 136 coupled by one or more hidden layers 140 in-between. The layers 132, 136, and 140 include output edges 142 and input edges 144. In various embodiments, one or more of the output edges 142 in at least one hidden layer 140 loops back 148 to one or more of the input edges 144 in the at least one hidden layer 140.

Figure 6:
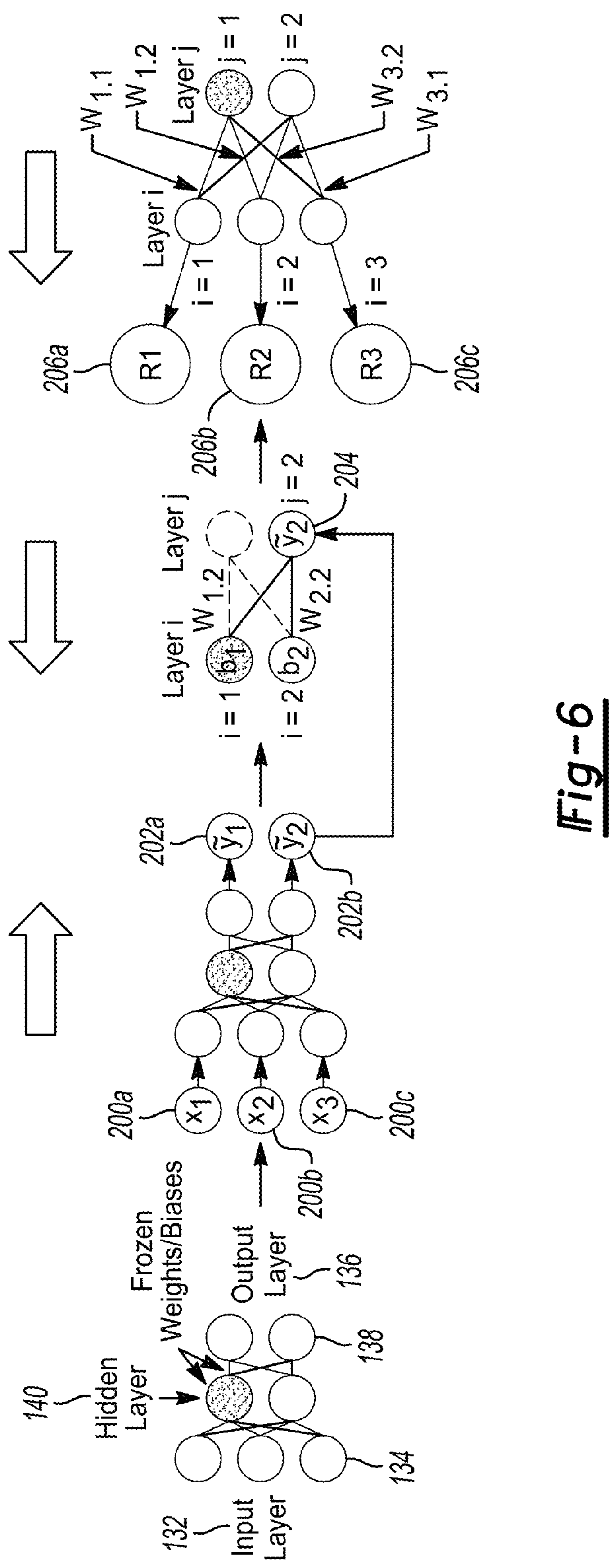
FIG. 6 is a functional flow diagram of a layer-wise relevance propagation in accordance with one or more exemplary embodiments.

Referring to FIG. 6, a functional flow diagram illustrating an example layer-wise relevance propagation 146*a* is shown in accordance with one or more exemplary embodiments. A graph neural network 130*a* with an input layer 132, multiple (e.g., three) input nodes 134, one or more hidden layers 140 (one shown) with multiple (e.g., two) hidden nodes, and an output layer 136 with multiple (e.g., two) output nodes 138 is used as an example. After training, weights and biases in the graph neural network 130*a* are frozen. Input samples 200*a*-200*c* provided to the input nodes 134 propagate left-to-right through the graph neural network 130*a* to generate output samples 202_a_-202_b_. A starting relevance sample 204 (e.g., 202_b_) is selected. Each path ending in the relevance sample 204 is propagated backward right-to-left through the graph neural network 130_a_ to previous layers. The relevance values 206_a_-206_c_ are provided at the input layer 132. An example propagation rule RR is provided in equation 1 as follows:

$$R_i = \sum_j \frac{a_i w_{i,j}^+ + \max(0, b_j)}{\sum_i a_i w_{i,j}^+ + \max(0, b_j)} R_j \tag{1}$$

Where $a_j$ is the output from node j, $w_{i,j}$ is a weight, and bi is a bias during a forward pass. Example relevance calculations are provided in equations 2 and 3 as follows:

$$R_{i=1} = \left(\frac{a_1 w_{1:2}}{a_1 w_{1:2} + a_2 w_{2:2}}\right)\hat{y}_2 \tag{2}$$

$$R_{i=2} = \left(\frac{a_2 w_{2:1}}{a_1 w_{1:2} + a_2 w_{2:2}}\right)\hat{y}_2 \tag{3}$$

The propagation continues until the input layer 132 is reached. At the input layer 132, a relevance calculation is provided at each input node 134. An example relevance calculation $R_{i=1}$ is provided in equation 4 as follows:

$$R_{i=1} = \left(\frac{w_{1:1}^2}{w_{1:1}^2 + w_{2:1}^2 + w_{3:1}^2}\right)R_{j=1} + \left(\frac{w_{1:2}^2}{w_{1:2}^2 + w_{2:2}^2 + w_{3:2}^2}\right)R_{j=2} \tag{4}$$

The relevance calculations are similar for the other input nodes 134. The relevance propagation may be repeated for each sample of interest.

Figure 7:
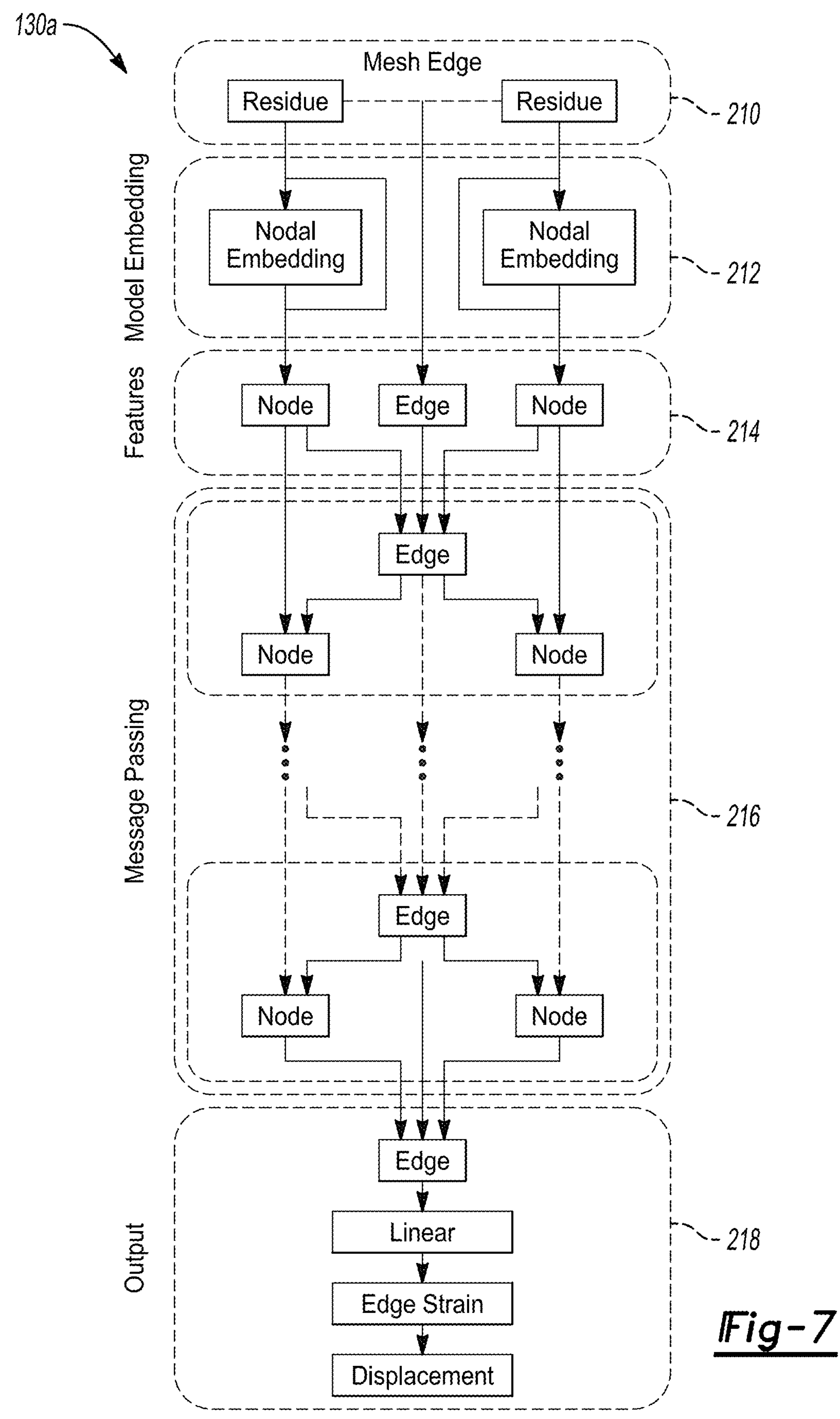
FIG. 7 is a functional flow diagram of operations in the graph neural network in accordance with one or more exemplary embodiments.

Referring to FIG. 7, a functional flow diagram of example operations in the graph neural network 130_a_ is shown in accordance with one or more exemplary embodiments. The mesh edges and residues of the model 94 provide initial input data at an input block 210. The mesh edges and residues are presented to a model embedding block 212. The model embedding block 212 performs nodal embedding operations on the residues and passes the edges through to the block 214. Node and edge features establish an initial graph in the block 214. Using a message passing neural network framework in block 216, the initial graph is accepted as input with information loaded into the nodes, edges, and global-context, and then the embeddings are progressively transformed through multiple layers without changing the connectivity of the input graph. In the message passing, the neighboring nodes or edges exchange information and influence each other's updated embeddings. In the output block 218, the final graph is established and includes linear, edge strain and displacement information.

Figure 8:
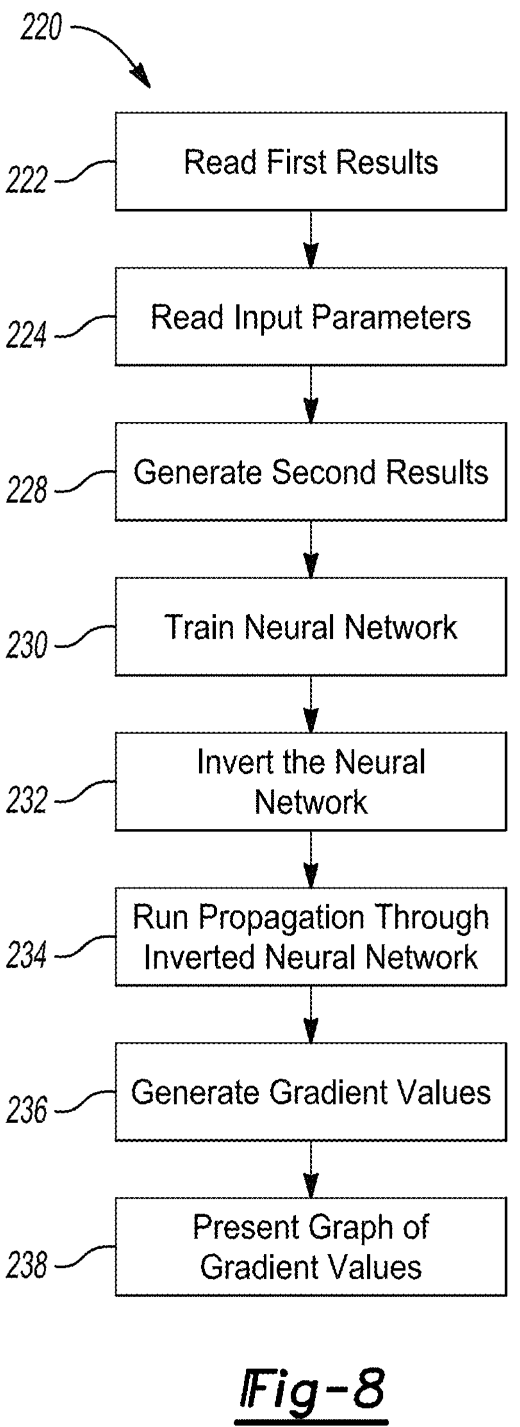
FIG. 8 is a flow diagram of a method for analyzing the model in accordance with one or more exemplary embodiments.

Referring to FIG. 8, a flow diagram of an example method 220 for analyzing the model 94 is shown in accordance with one or more exemplary embodiments. The method (or process) 220 may be performed by the system 100. The method 220 includes steps 222 to 238, as illustrated. The sequence of steps is shown as a representative example. Other step orders may be implemented to meet the criteria of a particular application.

In the step 222, the processor 120 reads the first results 112 from the storage device 110. The first results 112 were previously generated by one or more perturbations 96 of the structure 92 and subsequently stored in the storage device 110. The processor 120 also reads the input parameters 116 of the model 94 from the storage device 110 in the step 224. The model 94 is generated by the finite element modeling 98. In the step 228, the processor 120 generates the second results 114 by exercising the model 94 with the one or more perturbations 96.

The neural network 130 is trained in the step 230 to replicate the second results 114, same as the results generated by the model 94. The neural network 130 may include multiple input nodes 134 and multiple output nodes 138. A subset 118 of the input nodes 134 represent the input parameters 116 of the model 94. The output nodes 138 represent the second results 114. The neural network 130 is inverted in the step 232 to create an inverted neural network 130_b_.

In the step 234, the processor 120 runs a propagation through the inverted neural network 130_b_ from the output nodes 138 to the input nodes 134 to identify one or more of the input parameters 116 of the model 94 that substantially impact the second results 114. The processor 120 generates multiple gradient values 152 that represent how the second results 114 deviate from the first results 112 in the step 236. The gradient graph 150 of the gradient values 152 is assembled and presented in the step 238 at the output device 160.

Figure 9:
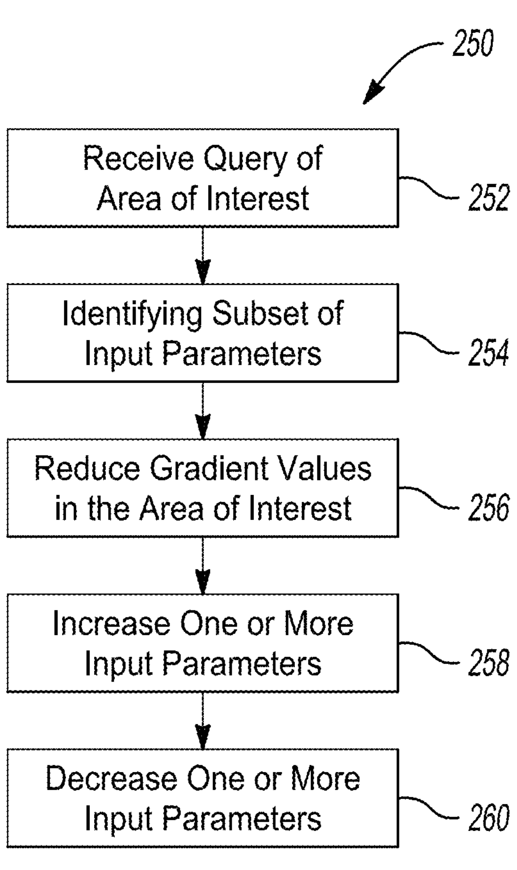
FIG. 9 is a flow diagram of a method for adjusting the model in accordance with one or more exemplary embodiments.

Referring to FIG. 9, a flow diagram of an example method for adjusting the model 94 is shown in accordance with one or more exemplary embodiments. The method (or process) 250 is performed by the system 100. The method 250 includes steps 252 to 260, as illustrated. The sequence of steps is shown as a representative example. Other step orders may be implemented to meet the criteria of a particular application.

In the step 252, the processor 120 receives a query 172 for an area of interest 174 in the gradient graph 150. The processor 120 identifies a subset of the input parameters 116 of the model 94 that are associated with the area of interest 174 using the layer-wise relevance propagation 146_a_ in the step 254. In the step 256, the processor 120 reduces the gradient values 152 within the area of interest 174 by automatically adjusting one or more of the input parameters 116 in the subset 118. Based on the gradient values 152 within area of interest 174, one or more of the corresponding input parameters 116 are increased in the step 258 and/or one or more of the corresponding input parameters 116 are decreased in the step 260.

Embodiments of the system 100 provide a technique that may quickly match a behavior of a model 94 to the behavior of the structure 92. Once matched, the model 94 may be a true representation of the structure 92 in the real world. The technique allows for variable sized problems without degradation of the results. A graph convolutional neural network is trained to solve problems with a finite element model. A generated model is used to propagate finite element model output data back to inputs using relevance propagation. A particular region or node of the model may be queried, and the relevance propagation highlight factors in the input data that markedly affects the output of the queried region or node.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A system comprising:

a storage device configured to:

store a plurality of first results generated by one or more perturbations of a structure; and store a plurality of input parameters of a model of the structure, wherein the model is generated by a finite element modeling;

a processor configured to:

generate a plurality of second results by exercising the model with the one or more perturbations;

train a neural network to replicate the plurality of second results, wherein the neural network includes a plurality of input nodes and a plurality of output nodes, a subset of the plurality of input nodes represent the plurality of input parameters of the model, and the plurality of output nodes represent the plurality of second results;

invert the neural network;

run a propagation through the neural network as inverted from the plurality of output nodes to the plurality of input nodes to identify one or more of the plurality of input parameters of the model that impact the plurality of second results; and generate a plurality of gradient values that represent how the plurality of second results deviate from the plurality of first results; and an output device configured to present a gradient graph of the plurality of gradient values to a user; and wherein the processor is further configured to:

receive a query from the user indicating an area of interest in the gradient graph;

in response to the received query, identify a subset of the plurality of input parameters of the model that are associated with the area of interest in the gradient graph; and reduce the plurality of gradient values within the area of interest by automatically adjusting one or more of the plurality of input parameters in the subset.

2. The system according to claim 1, wherein the plurality of gradient values in the area of interest determine if the one or more of the plurality of input parameters are increased or decreased.

3. The system according to claim 1, wherein the propagation is a layer-wise relevance propagation.

4. The system according to claim 1, wherein the neural network is a graph neural network.

5. The system according to claim 1, wherein the neural network comprises:

an input layer that includes the plurality of input nodes;

an output layer that includes the plurality of output nodes; and at least one hidden layer that couples the input layer to the output layer.

6. The system according to claim 5, wherein one or more of a plurality of output edges in the at least one hidden layer loops back to one or more of a plurality of input edges in the at least one hidden layer.

7. The system according to claim 1, wherein the output device is one or more of a display and a printer.

8. The system according to claim 3, wherein the processor is further configured to generate a relevance graph in response to the layer-wise relevance propagation, the relevance graph indicating input nodes of the subset of the plurality of input nodes that influence gradient values in the area of interest within the gradient graph.

9. The system according to claim 8, wherein the output device is further configured to present the relevance graph to the user.

10. A method for relevance propagation in a model of a structure comprising:

reading from a storage device a plurality of first results generated by one or more perturbations of the structure;

reading a plurality of input parameters of the model of the structure, wherein the model is generated by a finite element modeling;

generating a plurality of second results by exercising the model with the one or more perturbations;

training a neural network to replicate the plurality of second results, wherein the neural network includes a plurality of input nodes and a plurality of output nodes, a subset of the plurality of input nodes represent the plurality of input parameters of the model, and the plurality of output nodes represent the plurality of second results;

inverting the neural network;

running a propagation through the neural network as inverted from the plurality of output nodes to the plurality of input nodes to identify one or more of the plurality of input parameters of the model that impact the plurality of second results;

generating a plurality of gradient values that represent how the plurality of second results deviate from the plurality of first results; and presenting, to a user, a gradient graph of the plurality of gradient values from an output device;

receiving a query from the user indicating an area of interest in the gradient graph;

in response to the received query, identifying a subset of the plurality of input parameters of the model that are associated with the area of interest in the gradient graph; and reducing the plurality of gradient values within the area of interest by automatically adjusting one or more of the plurality of input parameters in the subset.

11. The method according to claim 10, further comprising:

determining if the one or more of the plurality of input parameters are to be increased or decreased in response to the plurality of gradient values in the area of interest.

12. The method according to claim 10, wherein the propagation is a layer-wise relevance propagation.

13. The method according to claim 10, wherein the neural network is a graph neural network.

14. The method according to claim 10, wherein the neural network comprises:

an input layer that includes the plurality of input nodes;

an output layer that includes the plurality of output nodes; and at least one hidden layer that couples the input layer to the output layer.

15. The method according to claim 14, further comprising:

looping back one or more of a plurality of output edges in the at least one hidden layer to one or more of a plurality of input edges in the at least one hidden layer.

16. The method according to claim 15, wherein the output device is one or more of a display and a printer.

17. The method according to claim 12, further comprising:

generating a relevance graph in response to the layer-wise relevance propagation, the relevance graph indicating input nodes of the subset of the plurality of input nodes that influence gradient values in the area of interest within the gradient graph.

18. The method according to claim 17, further comprising:

presenting, to the user, the relevance graph from the output device.

19. A non-transitory computer readable storage media containing processor executable instructions that cause a processor to perform the steps of:

reading from a storage device a plurality of first results generated by one or more perturbations of a structure;

reading a plurality of input parameters of the model of the physical structure, wherein the model is generated by a finite element modeling;

generating a plurality of second results by exercising the model with the one or more perturbations;

training a neural network to replicate the plurality of second results, wherein the neural network includes a plurality of input nodes and a plurality of output nodes, a subset of the plurality of input nodes represent the plurality of input parameters of the model, and the plurality of output nodes represent the plurality of output results;

inverting the neural network;

running a propagation through the neural network as inverted from the plurality of output nodes to the plurality of input nodes to identify one or more of the plurality of input parameters of the model that impact the plurality of second results;

generating a plurality of gradient values that represent how the plurality of second results deviate from the plurality of first results; and presenting, to a user, a gradient graph of the plurality of gradient values from an output device;

receiving a query from the user indicating an area of interest in the gradient graph;

in response to the received query, identifying a subset of the plurality of input parameters of the model that are associated with the area of interest in the gradient graph; and reducing the plurality of gradient values within the area of interest by automatically adjusting one or more of the plurality of input parameters in the subset.

20. The non-transitory computer readable storage media according to claim 19, wherein the propagation is a layer-wise relevance propagation, and wherein the processor is further configured to perform the steps of:

generating a relevance graph in response to the layer-wise relevance propagation, the relevance graph indicating input nodes of the subset of the plurality of input nodes that influence gradient values in the area of interest within the gradient graph; and presenting, to the user, the relevance graph from the output device.

* * * * *